US009337415B1

(12) United States Patent
Oh et al.

(10) Patent No.: US 9,337,415 B1
(45) Date of Patent: May 10, 2016

(54) PERPENDICULAR SPIN TRANSFER TORQUE (STT) MEMORY CELL WITH DOUBLE MGO INTERFACE AND COFEB LAYER FOR ENHANCEMENT OF PERPENDICULAR MAGNETIC ANISOTROPY

(71) Applicant: HGST Netherlands B.V., Amsterdam (NL)

(72) Inventors: Sangmun Oh, San Jose, CA (US); Zheng Gao, San Jose, CA (US); Kochan Ju, Los Gatos, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/664,644

(22) Filed: Mar. 20, 2015

(51) Int. Cl.
  *H01L 43/08* (2006.01)
  *H01L 43/02* (2006.01)
  *H01L 43/10* (2006.01)
  *G11C 11/16* (2006.01)

(52) U.S. Cl.
  CPC .............. *H01L 43/08* (2013.01); *G11C 11/161* (2013.01); *H01L 43/02* (2013.01); *H01L 43/10* (2013.01)

(58) Field of Classification Search
  CPC ......... H01L 43/08; H01L 43/02; H01L 43/10; G11C 11/161
  See application file for complete search history.

(56) References Cited

U.S. PATENT DOCUMENTS

| 7,479,394 | B2 * | 1/2009 | Horng | .................... | B82Y 25/00 257/E21.665 |
| 7,596,015 | B2 | 9/2009 | Kitagawa et al. | | |
| 8,064,244 | B2 | 11/2011 | Zhang et al. | | |
| 8,492,859 | B2 | 7/2013 | Hu | | |
| 8,836,000 | B1 | 9/2014 | Lin | | |
| 8,852,760 | B2 | 10/2014 | Wang et al. | | |
| 9,147,833 | B2 * | 9/2015 | Pi | .............. | H01L 43/04 |
| 2010/0109110 | A1 * | 5/2010 | Wang | ...................... | H01L 43/08 257/421 |
| 2013/0236744 | A1 * | 9/2013 | Brinkman | ............ | G11B 5/3906 428/811.2 |
| 2014/0077318 | A1 | 3/2014 | Kula et al. | | |
| 2014/0197504 | A1 | 7/2014 | Moriyama et al. | | |
| 2014/0264671 | A1 | 9/2014 | Chepulskyy et al. | | |
| 2015/0028440 | A1 * | 1/2015 | Liu | .......... | H01L 43/08 257/421 |
| 2015/0102441 | A1 * | 4/2015 | Gan | ........................ | H01L 43/02 257/422 |

OTHER PUBLICATIONS

Jan et al., "High Spin Torque Efficiency of Magnetic Tunnel Junctions with MgO/CoFeB/MgO Free Layer", Applied Physics Express 5 (2012) 093008.

(Continued)

*Primary Examiner* — William Coleman
(74) *Attorney, Agent, or Firm* — Thomas R. Berthold

(57) ABSTRACT

A magnetic tunnel junction (MTJ) for use in a magnetoresistive random access memory (MRAM) has a CoFeB alloy free layer located between the MgO tunnel barrier layer and an upper MgO capping layer, and a CoFeB alloy enhancement layer between the MgO capping layer and a Ta cap. The CoFeB alloy free layer has high Fe content to induce perpendicular magnetic anisotropy (PMA) at the interfaces with the MgO layers. To avoid creating unnecessary PMA in the enhancement layer due to its interface with the MgO capping layer, the enhancement layer has low Fe content. After all of the layers have been deposited on the substrate, the structure is annealed to crystallize the MgO. The CoFeB alloy enhancement layer inhibits diffusion of Ta from the Ta cap layer into the MgO capping layer and creates good crystallinity of the MgO by providing CoFeB at the MgO interface.

13 Claims, 3 Drawing Sheets

(56) References Cited

OTHER PUBLICATIONS

Thomas, et al., "Perpendicular STT-MRAM Chips with sub-5ns Writing", Invited Paper, 2014 14th Non-Volatile Memory Technology Symposium (NVMTS 2014) Oct. 27-29, 2014, Jeju, Korea.

Sato et al., "Properties of magnetic tunnel junctions with a MgO/CoFeB/Ta/CoFeB/MgO recording structure down to junction diameter of 11nm", Applied Physics Letters 105, 062403 (2014); doi: 10.1063/1.4892924.

Chun et al., "A Scaling Roadmap and Performance Evaluation of In-Plane and Perpendicular MTJ Based STT-MRAMs for High-Density Cache Memory", IEEE Journal of Solid-State Circuits, vol. 48, No. 2, Feb. 2013, 598.

Zhao et al., "Design considerations and strategies for high-reliable STT-MRAM", Microelectronics Reliability 51 (2011) 1454-1458.

* cited by examiner

PERPENDICULAR SPIN TRANSFER TORQUE (STT) MEMORY CELL WITH DOUBLE MGO INTERFACE AND COFEB LAYER FOR ENHANCEMENT OF PERPENDICULAR MAGNETIC ANISOTROPY

BACKGROUND OF THE INVENTION

1. Field of the Invention

The invention relates generally to spin transfer torque magnetoresistive random access memory (STT-MRAM) with perpendicular magnetic anisotropy (PMA), and more particularly to PMA STT memory cells with double MgO interfaces.

2. Background of the Invention

Spin transfer torque magnetoresistive random access memory (STT-MRAM) with magnetic tunnel junction (MTJ) memory cells having perpendicular magnetic anisotropy (PMA) is a strong candidate for future non-volatile memory. The MTJ memory cell has a free ferromagnetic layer (also called the recording layer or storage layer) and a reference ferromagnetic layer (also called the pinned layer) separated by a thin insulating tunnel barrier, which is typically MgO. The free and reference layers have PMA with magnetizations oriented perpendicular to the planes of the layers. The magnetization of the reference layer is pinned, but switching current through the MTJ causes the magnetization of the free layer to switch between the two orientations, parallel (P) or antiparallel (AP) to the reference layer magnetization, corresponding to resistances $R_P$ or $R_{AP}$. The tunneling magnetoresistance (TMR) of the MTJ is represented as $(R_{AP}-R_P)/R_P$. FIG. 1A is a schematic showing the two possible states of the MTJ. FIG. 1B is a highly schematic representation of a MRAM with an array of MTJ memory cells connected to word and bit lines in a well-known cross-point architecture.

In CoFeB/MgO/CoFeB PMA MTJs, the PMA originates from the interface between the CoFeB and MgO and has been attributed to hybridization of Fe 3d and O 2p orbitals. Since this PMA originates from the interface, there is thickness limitation of the free layer because thicker layers will exhibit in-plane anisotropy. Because the free layer of a PMA MTJ with a single CoFeB/MgO interface may not provide sufficient PMA for high thermal stability, a PMA MTJ with a double CoFeB/MgO interface structure has been proposed. ["Properties of magnetic tunnel junctions with a MgO/CoFeB/Ta/CoFeB/MgO recording structure down to junction diameter of 11 nm", H. Sato et al., *Applied Physics Letters* 105, 062403 (2014)]. In this structure the CoFeB free layer is sandwiched between the MgO tunnel barrier and an upper MgO capping layer, with a Ta cap formed on the MgO capping layer. However, this type of structure requires precise growth of the MgO layers while preventing the diffusion of Ta into the MgO layers during the annealing process.

What is needed is a double interface PMA MTJ memory cell with improved PMA and prevention of Ta diffusion during annealing.

SUMMARY OF THE INVENTION

Embodiments of this invention relate to a magnetic tunnel junction (MTJ) for use in a magnetoresistive random access memory (MRAM) with a CoFeB alloy free layer located between the MgO tunnel barrier layer and an upper MgO capping layer, and a CoFeB alloy enhancement layer between the MgO capping layer and a nonmagnetic cap, which is typically tantalum (Ta). Because the perpendicular magnetic anisotropy (PMA) originates from the interfaces between the CoFeB free layer and the two MgO layers and has been attributed to hybridization of Fe 3d and O 2p orbitals, the CoFeB alloy in the free layer should have high Fe content, i.e. preferably greater than 50 atomic percent. The CoFeB alloy enhancement layer has a specific composition substantially different from the composition of the CoFeB free layer and is deposited on the MgO capping layer before deposition of the Ta cap layer. To avoid creating unnecessary PMA in the enhancement layer due to its interface with the MgO capping layer, the enhancement layer should have low Fe content, preferably less than 20 atomic percent. After all of the layers have been deposited as full films on the substrate, the structure is annealed. This crystallizes the MgO and generates high tunneling magnetoresistance (TMR). The CoFeB alloy enhancement layer, with low Fe content, inhibits diffusion of Ta from the Ta cap layer into the MgO capping layer and also creates good crystallinity of the MgO by providing CoFeB at the MgO interface.

For a fuller understanding of the nature and advantages of the present invention, reference should be made to the following detailed description taken together with the accompanying figures.

DETAILED DESCRIPTION OF THE INVENTION

Figure 1A:
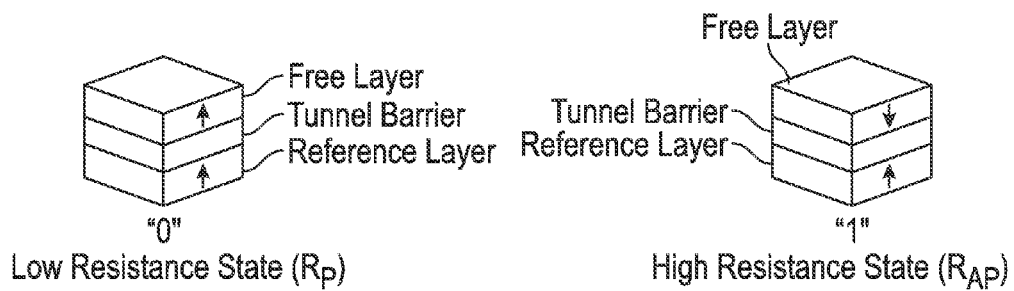
FIG. 1A is a schematic showing the two possible states of a perpendicular magnetic anisotropy (PMA) magnetic tunnel junction (MTJ) memory cell.
Figure 1B:
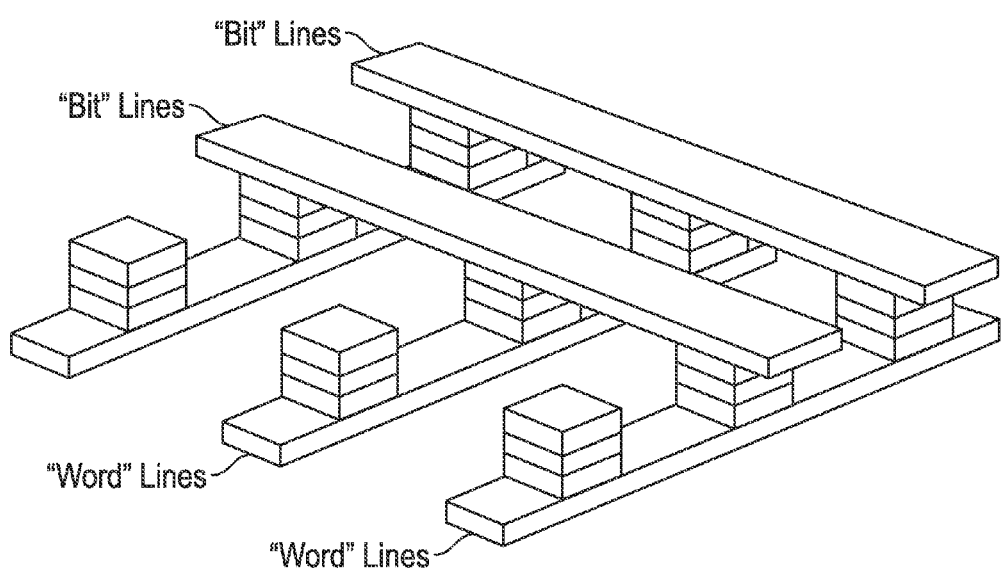
FIG. 1B is a highly schematic representation of a magnetoresistive random access memory (MRAM) with an array of MTJ memory cells connected to word and bit lines in a well-known cross-point architecture.
Figure 2:
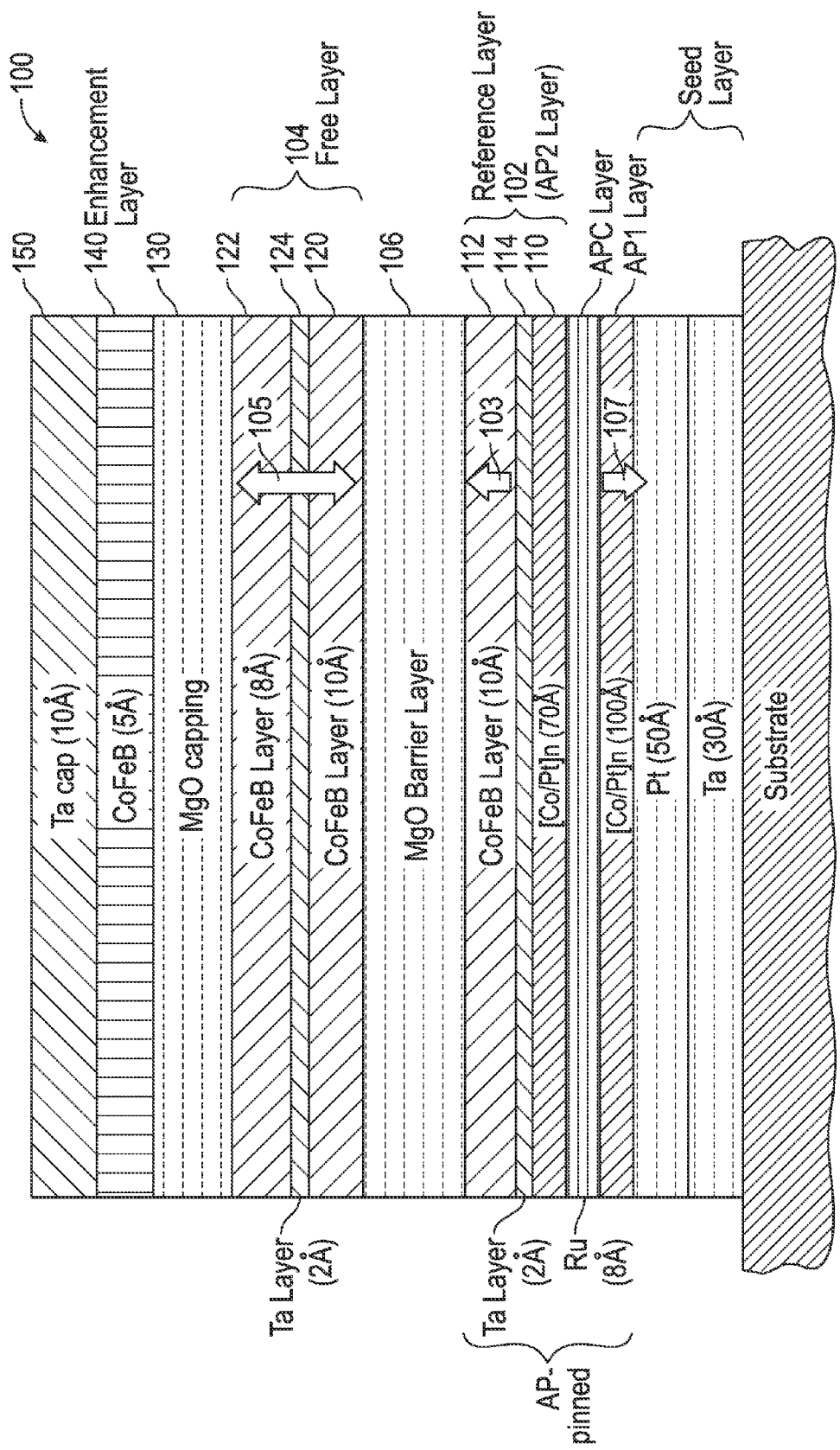
FIG. 2 is a sectional view of the layers making up the MTJ according to an embodiment of the invention.

FIG. 2 is a sectional view of the layers making up the MTJ according to an embodiment of the invention. The MTJ is substantially the same as the MTJ described in the previously cited Sato et al. publication with the exception of the CoFeB alloy enhancement layer between the MgO capping layer and the Ta cap layer.

The MTJ 100 includes a substrate, which may be formed of any suitable material like semiconductor grade silicon, oxidized silicon, or aluminum-titanium-carbide, a ferromagnetic reference layer 102 with a fixed magnetization 103 perpendicular to the plane of the reference layer, a ferromagnetic free layer 104 with a magnetization 105 that is capable of being switched between parallel and antiparallel to the reference layer's magnetization 103, and an insulating oxide barrier layer 106, which is typically MgO, between the reference layer 102 and the free layer 104.

In this example, the reference layer 102 is the AP2 layer portion of an antiparallel (AP)-pinned structure. An AP-pinned structure is well known and includes first (AP1) and second (AP2) ferromagnetic layers separated by a nonmagnetic antiparallel-coupling (APC) layer. The APC layer couples the AP1 and AP2 layers together antiferromagnetically so that their magnetization are oriented substantially antiparallel, as shown by AP2 layer's magneization 103 and AP1 layer's magnetization 107. In this example the APC layer is a 8 Å Ru layer and the AP1 layer is a well-known [Co/Pt]n multilayer, where "n" refers to the number of Co/Pt pairs. The AP2 layer (reference layer 102) is a lower [Co/Pt]n multilayer 110, an upper CoFeB layer 112 and a Ta breaking layer 114 between layers 110 and 112. [Co/Pt]n multilayers are well known for having perpendicular magnetic anisotropy. A seed layer, in this example a Ta/Pt bilayer, is formed on the substrate prior to deposition of the AP1 multilayer.

While the embodiment of the invention has been described for an MTJ with the reference layer as part of an AP-pinned structure, the invention is fully applicable with other types of reference layers. For example, the reference layer may be a "simple" pinned structure, such as a single CoFeB alloy layer whose magnetization is pinned by an antiferromagnetic layer.

The MTJ 100 is a double MgO layer MTJ in that the CoFeB alloy free layer 104 is located between MgO tunnel barrier layer 106 and an upper MgO capping layer 130. A strong PMA originates from the interface between the CoFeB and the MgO. Since the anisotropy is purely interfacial in nature, the CoFeB alloy free layer has to be thin, usually below about 12 Å, to retain PMA because a thicker CoFeB layer will exhibit in-plane anisotropy. Thus to have high strong PMA with a thicker CoFeB layer, the second MgO layer (the MgO capping layer) provides a second interface. The free layer 104 in this example is two CoFeB films 120, 122 separated by a nonmagnetic separation film 124, like Ta, with each CoFeB film having a thickness preferably on the range of 5 to 15 Å. The Ta separation film 124 creates two thinner CoFeB films, each of which has an interface with an MgO layer to create the PMA. Because the PMA originates from the interface between the CoFeB and MgO and has been attributed to hybridization of Fe 3d and O 2p orbitals, the CoFeB alloy in the free layer should have high Fe content. The composition of the CoFeB alloy in the free layer 104 should thus preferably have the composition $(Co_{(100-x)}Fe_x)_{(100-y)}B_y$, where x is in atomic percent and is greater than or equal to 25 (preferably greater than 50) and less than or equal to 95 and y is in atomic percent and is greater than or equal to 10 and less than or equal to 30.

In this invention, a CoFeB alloy enhancement layer 140, with a specific composition substantially different from the composition of the CoFeB free layer 104, is deposited on the MgO capping layer 130 before deposition of the Ta cap layer 150. To avoid creating unnecessary PMA in the enhancement layer 140 due to its interface with the MgO capping layer 130, the enhancement layer 140 should have low Fe content. The composition of the CoFeB alloy in the enhancement layer 140 should thus preferably have the composition $(Co_{(100-x)}Fe_x)_{(100-y)}B_y$, where x is in atomic percent and is greater than or equal to 4 and less than or equal to 20 and y is in atomic percent and is greater than or equal to 15 and less than or equal to 25. The enhancement layer 140 has a thickness preferably on the range of 3 to 10 Å.

After all of the layers have been deposited as full films on the substrate, the structure is annealed, typically at a temperature between about 350 to 400° C. for a period of between about 30 to 60 minutes. This crystallizes the MgO and generates high TMR. However, in the prior art MTJ without the enhancement layer according to this invention, the annealing may cause diffusion of the Ta into the MgO layer, which would alter the crystallinity of the MgO and reduce the PMA of the CoFeB alloy free layer. However, in this invention the CoFeB alloy enhancement layer 140, with low Fe content, inhibits diffusion of Ta from the Ta cap layer 150 into the MgO capping layer 130 and also creates good crystallinity of the MgO by providing CoFeB at the MgO interface.

Figure 3:
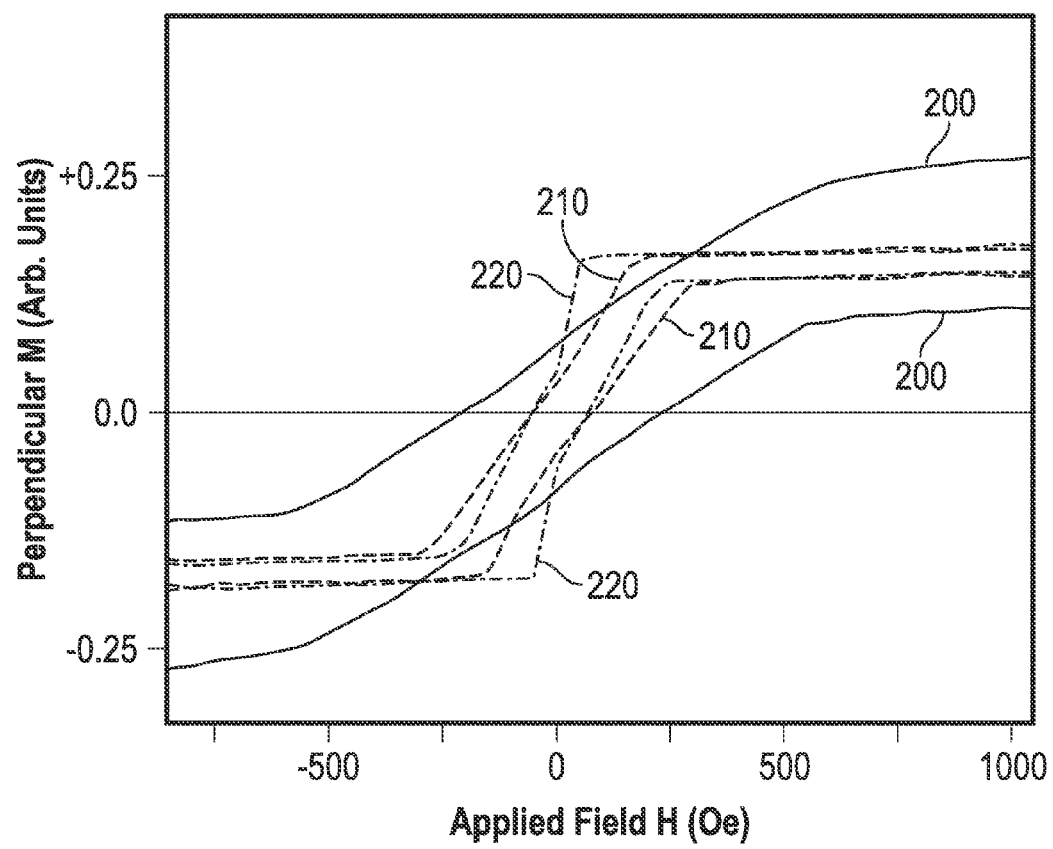
FIG. 3 illustrates portions of perpendicular magnetization-applied field (M-H) loops for a prior art MTJ structure and two MTJ structures according to an embodiment of the invention.

FIG. 3 illustrates portions of three magnetization-field (M-H) loops for three different MTJ structures. Loop 200 is for a prior art MTJ structure without the CoFeB alloy enhancement layer and thus with Ta cap 150 in contact with the MgO capping layer. Loop 210 is for a MTJ structure with a 3 Å $Co_{76}Fe_4B_{20}$ alloy enhancement layer 140 between the Ta cap 150 and the MgO capping layer 130. Loop 220 is for a MTJ structure with a 5 Å $Co_{76}Fe_4B_{20}$ alloy enhancement layer 140 between the Ta cap 150 and the MgO capping layer 130. The slope of the M-H loop 200 is very shallow, indicating low PMA and thus low TMR. However, loops 210 and 220 are substantially steeper, and increase with increasing enhancement layer thickness from 3 Å to 5 Å.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunnel junction memory cell comprising:
   a substrate;
   a ferromagnetic reference layer having perpendicular magnetic anisotropy on the substrate, the reference layer having a fixed magnetization substantially perpendicular to the plane of the reference layer;
   a ferromagnetic free layer comprising Co, Fe and B and having perpendicular magnetic anisotropy, the free layer having a magnetization substantially perpendicular to the plane of the free layer and capable of being switched between substantially parallel and substantially antiparallel to the magnetization of the reference layer;
   an insulating oxide tunnel barrier layer between the reference layer and the free layer;
   an insulating oxide capping layer on and in contact with the free layer;
   a ferromagnetic enhancement layer on and in contact with the insulating oxide capping layer and comprising Co, Fe and B; and
   a nonmagnetic cap layer on the enhancement layer.

2. The memory cell of claim 1 wherein the insulating oxide tunnel barrier layer and the insulating oxide capping layer each consists of MgO.

3. The memory cell of claim 1 wherein the nonmagnetic cap layer consists of Ta.

4. The memory cell of claim 1 wherein the free layer comprises first and second CoFeB alloy films and a nonmagnetic separation film between said first and second CoFeB alloy films.

5. The memory cell of claim 1 wherein the free layer consists of a CoFeB alloy having a composition of the form $(Co_{(100-x)}Fe_x)_{(100-y)}B_y$, where x is in atomic percent and is greater than or equal to 25 and less than or equal to 95 and y is in atomic percent and is greater than or equal to 15 and less than or equal to 25.

6. The memory cell of claim 1 wherein the enhancement layer has a composition of the form $(Co_{(100-x)}Fe_x)_{(100-y)}B_y$, where x is in atomic percent and is greater than or equal to 4 and less than or equal to 20 and y is in atomic percent and is greater than or equal to 15 and less than or equal to 25.

7. The memory cell of claim 1 wherein the enhancement layer has a thickness greater than or equal to 3 Å and less than or equal to 10 Å.

8. The memory cell of claim 1 wherein the memory cell includes an antiparallel (AP) pinned structure comprising a first AP-pinned (AP1) ferromagnetic layer having a perpendicular-to-the-plane magnetization, a second AP-pinned (AP2) ferromagnetic layer having a perpendicular-to-the-plane magnetization substantially antiparallel to the magnetization of the AP1 layer, and an AP coupling (APC) layer between and in contact with the AP1 and AP2 layers, wherein the AP2 layer comprises said reference layer.

9. A magnetic random access memory (MRAM) comprising an array of memory cells according to claim 1, a plurality of bit lines connected to the memory cells, and a plurality of word lines connected to the memory cells.

10. The memory cell of claim 4 wherein each of the first and second CoFeB alloy films has a thickness greater than or equal to 5 Å and less than or equal to 15 Å.

11. A magnetic tunnel junction memory cell comprising:
   a substrate;
   a ferromagnetic reference layer comprising a CoFeB alloy on the substrate and having perpendicular magnetic anisotropy, the reference layer having a fixed magnetization substantially perpendicular to the plane of the reference layer;
   a ferromagnetic free layer having perpendicular magnetic anisotropy, the free layer having a magnetization substantially perpendicular to the plane of the free layer and capable of being switched between substantially parallel and substantially antiparallel to the magnetization of the reference layer, the free layer comprising first and second CoFeB alloy films and a nonmagnetic separation film between said first and second CoFeB alloy films;
   an insulating MgO tunnel barrier layer between the reference layer and the free layer;
   an insulating MgO capping layer on and in contact with the free layer;
   a ferromagnetic enhancement layer on and in contact with the insulating MgO capping layer, the enhancement layer having a composition of the form $(Co_{(100-x)}Fe_x)_{(100-y)}B_y$, where x is in atomic percent and is greater than or equal to 4 and less than or equal to 20 and y is in atomic percent and is greater than or equal to 15 and less than or equal to 25; and
   a Ta cap layer on the enhancement layer.

12. The memory cell of claim 11 wherein the enhancement layer has a thickness greater than or equal to 3 Å and less than or equal to 10 Å.

13. The memory cell of claim 11 wherein the memory cell includes an antiparallel (AP) pinned structure comprising a first AP-pinned (AP1) ferromagnetic layer having a perpendicular-to-the-plane magnetization, a second AP-pinned (AP2) ferromagnetic layer having a perpendicular-to-the-plane magnetization substantially antiparallel to the magnetization of the AP1 layer, and an AP coupling (APC) layer between and in contact with the AP1 and AP2 layers, wherein the AP2 layer comprises said reference layer.

\* \* \* \* \*